(12) United States Patent
Choe et al.

(10) Patent No.: US 8,436,308 B2
(45) Date of Patent: May 7, 2013

(54) MULTILAYER IMAGE SENSOR

(75) Inventors: Won-hee Choe, Gyeongju-si (KR); Seong-deok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 289 days.

(21) Appl. No.: 12/345,776

(22) Filed: Dec. 30, 2008

(65) Prior Publication Data

US 2009/0278048 A1 Nov. 12, 2009

(30) Foreign Application Priority Data

May 9, 2008 (KR) .................. 10-2008-0043482

(51) Int. Cl.
*G01J 5/02* (2006.01)

(52) U.S. Cl.
USPC .................................................. 250/339.05

(58) Field of Classification Search .............. 250/339.05
See application file for complete search history.

(56) References Cited

U.S. PATENT DOCUMENTS

| | | | |
|---|---|---|---|
| 3,806,633 A * | 4/1974 | Coleman | 348/33 |
| 4,246,601 A | 1/1981 | Sato et al. | |
| 4,651,001 A * | 3/1987 | Harada et al. | 250/330 |
| 5,309,243 A | 5/1994 | Tsai | |
| 5,317,427 A | 5/1994 | Ichikawa | |
| 5,373,182 A | 12/1994 | Norton | |
| 5,506,618 A | 4/1996 | Yoneyama et al. | |
| 5,965,875 A | 10/1999 | Merrill | |
| 5,981,950 A | 11/1999 | Wolny et al. | |
| 6,107,618 A * | 8/2000 | Fossum et al. | 250/208.1 |
| 6,150,930 A * | 11/2000 | Cooper | 340/435 |
| 6,169,577 B1 | 1/2001 | Iizuka | |
| 6,211,521 B1 * | 4/2001 | Bawolek et al. | 250/339.02 |
| 6,330,029 B1 | 12/2001 | Hamilton et al. | |
| 6,366,319 B1 | 4/2002 | Bills | |
| 6,522,356 B1 | 2/2003 | Watanabe | |
| 6,529,239 B1 | 3/2003 | Dyck et al. | |
| 6,628,331 B1 | 9/2003 | Bean | |
| 6,628,841 B1 | 9/2003 | Watanabe | |
| 6,657,663 B2 | 12/2003 | Morris | |
| 6,690,421 B1 | 2/2004 | Yamada et al. | |
| 6,714,243 B1 | 3/2004 | Mathur et al. | |
| 6,757,016 B1 | 6/2004 | Ueno et al. | |
| 6,771,282 B2 | 8/2004 | Yanagi et al. | |
| 6,771,314 B1 | 8/2004 | Bawolek et al. | |
| 6,783,900 B2 | 8/2004 | Venkataraman | |
| 6,803,955 B1 | 10/2004 | Yosida | |
| 6,825,470 B1 * | 11/2004 | Bawolek et al. | 250/339.05 |
| 6,825,884 B1 | 11/2004 | Horiuchi | |
| 6,831,692 B1 | 12/2004 | Oda | |

(Continued)

FOREIGN PATENT DOCUMENTS

| | | |
|---|---|---|
| EP | 0 859 412 | 8/1998 |
| EP | 1 630 871 | 3/2006 |

(Continued)

*Primary Examiner* — David Porta
*Assistant Examiner* — Djura Malevic
(74) *Attorney, Agent, or Firm* — NSIP Law (57) ABSTRACT

An image sensor is provided which includes a multilayer structure having a first light receiving unit to extract a signal corresponding to color information of incident light of a visible region and a second light receiving unit to extract a signal corresponding to light of an infrared region and white light corresponding to the visible region.

23 Claims, 6 Drawing Sheets

U.S. PATENT DOCUMENTS

| | | |
|---|---|---|
| 6,847,397 B1 | 1/2005 | Osada |
| 6,853,044 B1 | 2/2005 | Chung et al. |
| 6,864,916 B1 | 3/2005 | Nayar et al. |
| 6,867,802 B2 | 3/2005 | Jaspers |
| 6,946,715 B2 | 9/2005 | Hong |
| 7,154,157 B2 * | 12/2006 | Bradski et al. ............... 257/440 |
| 7,170,046 B2 * | 1/2007 | Higashitsutsumi ........... 250/226 |
| 7,274,393 B2 * | 9/2007 | Acharya ....................... 348/273 |
| 2004/0207734 A1 | 10/2004 | Horiuchi |
| 2005/0212934 A1 | 9/2005 | Hoshuyama |
| 2005/0243177 A1 | 11/2005 | Kang et al. |
| 2006/0066738 A1 | 3/2006 | Hershey et al. |
| 2006/0114551 A1 * | 6/2006 | Okada et al. ................. 359/350 |
| 2006/0124833 A1 | 6/2006 | Toda |
| 2006/0181623 A1 | 8/2006 | Endo et al. |
| 2006/0186322 A1 | 8/2006 | Matsuyama |
| 2007/0201738 A1 * | 8/2007 | Toda et al. ................... 382/144 |
| 2007/0273781 A1 | 11/2007 | Choe et al. |
| 2008/0068475 A1 * | 3/2008 | Choe et al. ................... 348/273 |
| 2008/0087800 A1 * | 4/2008 | Toda ........................ 250/214 C |
| 2008/0230123 A1 * | 9/2008 | Mitsui et al. ................. 136/263 |
| 2008/0283729 A1 * | 11/2008 | Hosaka ..................... 250/208.1 |

FOREIGN PATENT DOCUMENTS

| | | |
|---|---|---|
| JP | 03-114388 | 5/1991 |
| JP | 2004-304706 | 10/2004 |
| JP | 2005-006066 | 1/2005 |
| JP | 2006-033483 | 2/2006 |
| JP | 2006-165362 | 6/2006 |
| JP | 2006-190958 | 7/2006 |
| JP | 2006-211478 | 8/2006 |
| JP | 2006-237737 | 9/2006 |
| JP | 2007-329227 | 12/2007 |
| JP | 2007-329380 | 12/2007 |
| KR | 10-2005-0098958 | 10/2005 |
| KR | 10-2006-0093651 | 8/2006 |
| KR | 10-2007-0083300 | 8/2007 |
| KR | 10-2007-0113912 | 11/2007 |
| KR | 10-2008-0026001 | 3/2008 |
| WO | WO 00/07365 | 2/2000 |
| WO | WO 2006/080220 | 8/2006 |

* cited by examiner

MULTILAYER IMAGE SENSOR

CROSS REFERENCE TO RELATED APPLICATIONS

This application claims the benefit under 35 U.S.C. §119 (a) of Korean Patent Application No. 10-2008-0043482, filed on May 9, 2008, the disclosure of which is incorporated herein in its entirety by reference.

TECHNICAL FIELD

The following description relates to an image sensor, and more particularly, to a multilayer image sensor which may simultaneously obtain a color image and a black-and-white image containing infrared radiation (IR) information.

BACKGROUND

High-resolution camera devices such as digital cameras and camera-mounted mobile phones have been widely used. A digital camera generally includes a lens, an image sensor, and a digital signal processor (DSP). The lens condenses light reflected from an object to be photographed, and transmits the light to the image sensor, which detects the condensed light and converts the light into an electric signal. The DSP performs a digital signal processing on the electric signal from the image sensor such that a user may view an image or store the photographed image.

Image sensors typically comprise image pickup tubes and solid image sensors, and a charge-coupled device (CCD) and a complementary metal-oxide semiconductor (CMOS) are the common type of the solid image sensor.

A CCD image sensor is formed of a circuit where several pairs of capacitors are connected to one another, and capacitors transfer electrodes accumulated thereon to an adjacent capacitor. The CCD image sensor or chip includes a plurality of photodiodes, each of which generates electrons according to an amount of light incident thereto. Information generated by the photodiode is reconstructed to form image information.

Since it is possible to manufacture a CMOS image sensor by use of a general-use semiconductor manufacturing apparatus, the CMOS image sensor costs less than a CCD image sensor in terms of manufacturing expense. Accordingly, the CMOS image sensors are widely used for inexpensive digital cameras or television cameras having slow frames. However, in low light, pixels of the CMOS image sensor may become easily unstable and a substantial amount of noise may occur in a photographed image.

With respect to a recently introduced contact image sensor (CIS), deterioration of sensitivity of photographed images may occur as the number of valid pixels increases.

SUMMARY

Accordingly, in one aspect, there is provided a multilayer image sensor which simultaneously obtains both a color image and a black-and-white image containing infrared radiation (IR) information.

According to another aspect, there is provided a multilayer image sensor which obtains a signal corresponding to color information, for example, an RGB signal, a signal corresponding to white light information and IR information, for example, a W+4 IR signal.

According to yet another aspect, there is provided a multilayer image sensor in which separate readouts are provided for a signal corresponding to color information and a signal corresponding to IR and white light information.

According to still another aspect, there is provided a multilayer image sensor comprising a first light receiving unit which detects light of specific wavelength ranges within a visible region of a light spectrum, a second light receiving unit which detects white light corresponding to the visible region, and a third light receiving unit which detects light of an infrared region.

The first light receiving unit may extract color information of incident light. The color information may be one of a red-green-blue (RGB) signal and a cyan-magenta-yellow (CMY) signal. The second and third light receiving units extract a white and infrared radiation (W+IR) signal.

The multilayer image sensor may further comprise a readout circuit provided for the RGB or CMY signal, and a different readout circuit provided for the W+IR signal.

The first and second light receiving units may pass light of the infrared region, and the third light receiving unit may be disposed with respect to the first and second light receiving units so that the extracted W+IR signal is a W+4 IR signal.

The first light receiving unit may detect red light, green light, or blue light, and convert the amount of the light detected thereby into an electric signal, the second light receiving unit may detect the white light, and convert the amount of the white light detected thereby into an electric signal, and the third light receiving unit may detect infrared light, and convert the amount of the infrared light detected thereby into an electric signal.

The first and second light receiving units may pass light of the infrared region.

The multilayer image sensor may simultaneously obtain both a color image and a black-and-white image containing infrared radiation (IR) information.

The multilayer image sensor may include upper and lower layers, the first and second light receiving units may be disposed on or as the upper layer, and the third light receiving unit may be disposed on or as the lower layer.

The third light receiving unit may be disposed under the first and/or second light receiving units.

The second and third light receiving units may be integrated together or formed independently from each other.

The multilayer image sensor may further comprise a color filter which comprises color filter parts that pass the light of specific wavelength ranges within the visible region and the light of the infrared region, and a transparent part that passes the white light and the light of the infrared region.

The first light receiving unit may be disposed under the color filter parts, and the second light receiving unit may be disposed under the transparent part.

According to still another aspect, there is provided a multilayer image sensor comprising a pixel unit which detects light of a specific wavelength range within a visible region of a light spectrum, and a white and infrared radiation (wide-band) pixel unit which detects all visible light of the visible region and infrared light within an infrared region of the light spectrum.

The pixel unit may be one of a red-green-blue (RGB) pixel unit and a cyan-magenta-yellow (CMY) pixel unit.

The RGB pixel unit may be formed of a plurality of light receiving elements, each of which detects red, green, or blue light, and converts the amount of the detected light into an electric signal.

The wide-band pixel unit may comprise a white pixel unit which is disposed on the same layer as the pixel unit and detects all visible light of the visible region, and an IR pixel unit which is disposed under the pixel unit and/or the white pixel unit and detects the infrared light within the infrared region.

The pixel unit and the wide-band pixel unit may be controlled individually by different readout circuits.

The wide-band pixel unit and the pixel unit may be controlled such that a light exposure time of the wide-band pixel unit is set to be shorter than that of the pixel unit.

According to still another aspect, there is provided an image sensor comprising a multilayer structure having a first light receiving unit to extract a signal corresponding to color information of incident light of a visible region and a second light receiving unit to extract a signal corresponding to light of an infrared region and white light corresponding to the visible region.

The first light receiving unit may detect light of specific wavelength ranges within the visible region, and the second light receiving unit may comprise a light receiving unit which detects the white light and a light receiving unit which detects the light of the infrared region.

The signal extracted by the first light receiving unit may be one of a red-green-blue (RGB) signal and a cyan-magenta-yellow (CMY) signal, and the signal extracted by the second light receiving unit may be a white and infrared radiation (W+IR) signal.

The first light receiving unit and the light receiving unit which detects the white light may pass light of the infrared region, and the light receiving unit which detects the light of the infrared region may be disposed with respect to the first light receiving unit and the light receiving unit which detects the white light such that the extracted W+IR signal is one of a W+IR signal, a W+2 IR signal, a W+3 IR signal, and a W+4 IR signal. For example, the W+4 IR signal may correspond to white light information and information resulting from infrared light passing though each of the light receiving unit which detects the white light and portions of the first light receiving unit for detecting red light, green light and blue light.

The image sensor may further comprise a readout circuit provided for the RGB or CMY signal, and a different readout circuit provided for the W+IR signal.

According to still another aspect, there is provided an image sensor comprising a multilayer structure having a first light receiving unit to extract a signal corresponding to color information of incident light of a visible region and a second light receiving unit to extract a signal corresponding to light of an infrared region, wherein the first light receiving unit detects light of specific wavelength ranges within the visible region, and different readout circuits are provided for the signal corresponding to the color information and the signal corresponding to the light of the infrared region.

The signal extracted by the second light receiving unit may further correspond to white light corresponding to the visible region.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, unless otherwise described, the same drawing reference numerals will be understood to refer to the same elements, features, and structures. The elements may be exaggerated for clarity and convenience.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

Figure 1:
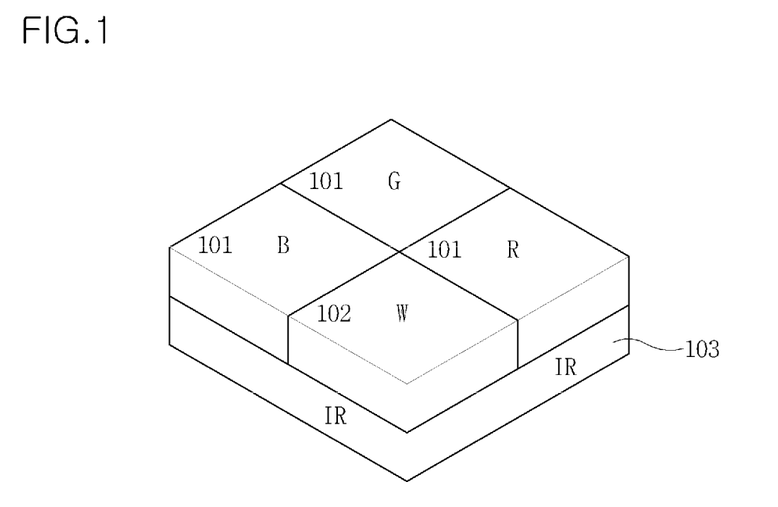
FIG. 1 is a block diagram of an image sensor according to an exemplary embodiment.

FIG. 1 shows an image sensor according to an exemplary embodiment. Referring to FIG. 1, the image sensor comprises a first light receiving unit 101, a second light receiving unit 102, and a third light receiving unit 103, and is formed of at least two layers.

For example, the first and second light receiving units 101 and 102 may be disposed on or as an upper layer, and the third light receiving unit 103 may be disposed on or as a lower layer. Each of the light receiving units 101, 102, and 103 may be formed of silicon elements fabricated by a semiconductor process. Thus, where light is incident to the image sensor, light with a shorter wavelength is absorbed by a top of a silicon layer, and light with a longer wavelength is absorbed by a lower part of the silicon layer.

Each of the light receiving units 101, 102, and 103 may be a photodiode which senses incident light and converts the amount of sensed light into an electric signal to be output. Each light receiving unit 101, 102, and 103 may sense different types of light.

Figure 2:
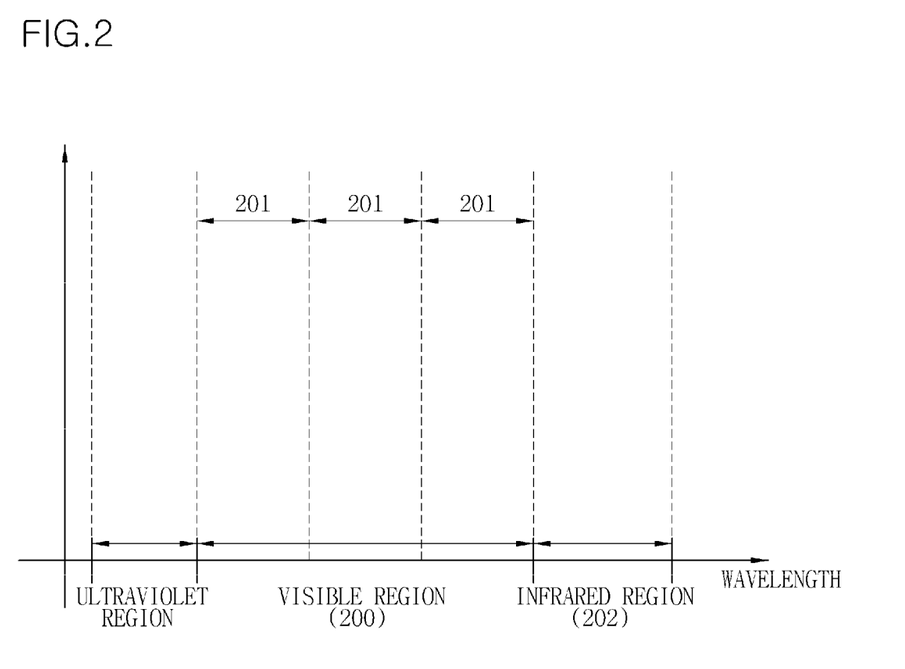
FIG. 2 is a diagram illustrating regions within a light spectrum.

For instance, the light incident to the image sensor may be divided into an ultraviolet region, a visible region, and an infrared region according to wavelength, as shown in FIG. 2. Light (e.g. 201) within a particular wavelength band in the visible region may be detected by the first light receiving unit 101, light (e.g. 200) ranging over the entire band of wavelengths in the visible region may be detected by the second light receiving unit 102, and light (e.g. 202) within an infrared region may be detected by the third light receiving unit 103.

To this end, the first light receiving unit 101 may be a photodiode which extracts color information of the light (e.g. red light, green light, or blue light) within the particular wavelength band in the visible region. The color information of the light may be, for example, either an RGB signal or a CMY signal. Although an RGB sensor that detects an RGB signal is discussed as the first light receiving unit 101, the type of first light receiving unit is not limited thereto, and various kinds of optical sensors for detecting color information of light may be used.

Returning to the example, the second light receiving unit 102 may be a photodiode that detects light (e.g. white light) ranging over the entire band of wavelengths in the visible region, and the third light receiving unit 103 may be a photodiode that detects light (e.g. infrared light) within the infrared region.

The first and second light receiving units 101 and 102 disposed on or as a top layer may pass light within an infrared region such that the third light receiving unit 103 disposed on or as a lower layer may absorb the light. Each of the light receiving units 101, 102, and 103 may be formed of silicon elements manufactured by a semiconductor process. Also, since the depth (or location) of the silicon layer by which the light is absorbed varies according to a wavelength of the absorbed light, the first and second light receiving units 101 and 102 may absorb light within the visible region, and the third light receiving unit 103 may absorb light within the infrared region in which wavelengths are longer than those in the visible region.

The types of light detected by the first and second light receiving units 101 and 102 may be determined by color filters attached with respect to the image sensor.

Figure 3:
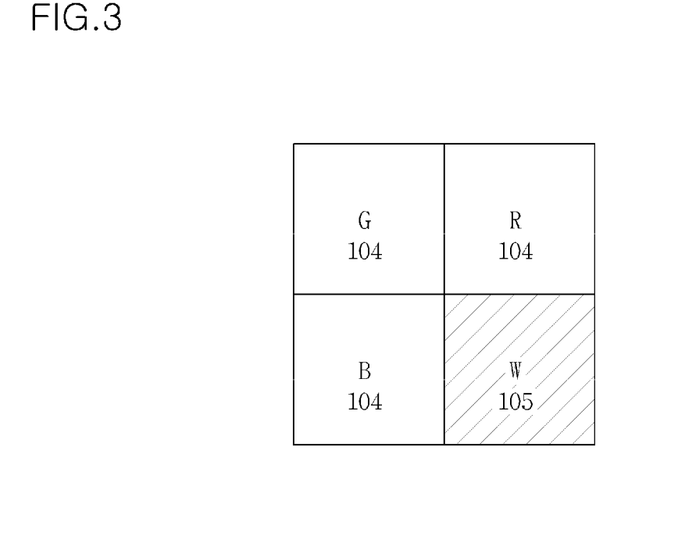
FIG. 3 is a diagram illustrating a color filter according an exemplary embodiment.

FIG. 3 shows a color filter according an exemplary embodiment. Referring to FIG. 3, the color filter comprises color filter parts 104 and a transparent part 105. The color filter may not block infrared radiation, and thus may pass all incident infrared radiation.

Each of the color filter parts1O4 passes light (e.g. colors of red, green, or blue) within a specific wavelength band and light (e.g. infrared light) within an infrared region. The transparent part 105 passes light ranging over the entire band of wavelengths in a visible region and light within the infrared region. For example, referring to FIG. 2 again, the color filter parts 104 pass light within specific wavelength ranges (e.g. 201) in the visible region, and light within the infrared region 202. The transparent part 105 passes light of wavelength ranging over the entire visible region 200 and light within the infrared region 202.

To this end, the color filter parts 104 may selectively pass red light, green light or blue light. The color filter parts 104 may be an RGB filter that does not block the infrared radiation, and the transparent part 105 may be formed of a transparent material such as glass or plastic. For instance, in FIG. 3, the color filter parts (104) R, G, and B selectively pass red light, green light, and blue light, respectively, and the transparent part (105) W passes white light which is a mixture having the red, green, and blue light.

The color filter in accordance with an exemplary embodiment passes all infrared light, uses the color filter parts 104 to selectively pass only the light having color information such as RGB, and uses the transparent part 105 to pass light within all wavelength ranges or exemplary ranges discussed above.

Where such color filter is disposed on the image sensor shown in FIG. 1, the first light receiving unit 101 may be disposed under the color filter parts 104 and the second light receiving unit 102 may be disposed under the transparent part 105. In this case, the color filter parts 104 filter light within specific wavelength ranges such that the first light receiving unit 101 receives the light, and the transparent part 105 allows white light to pass through to reach the second light receiving unit 102.

Figure 4:
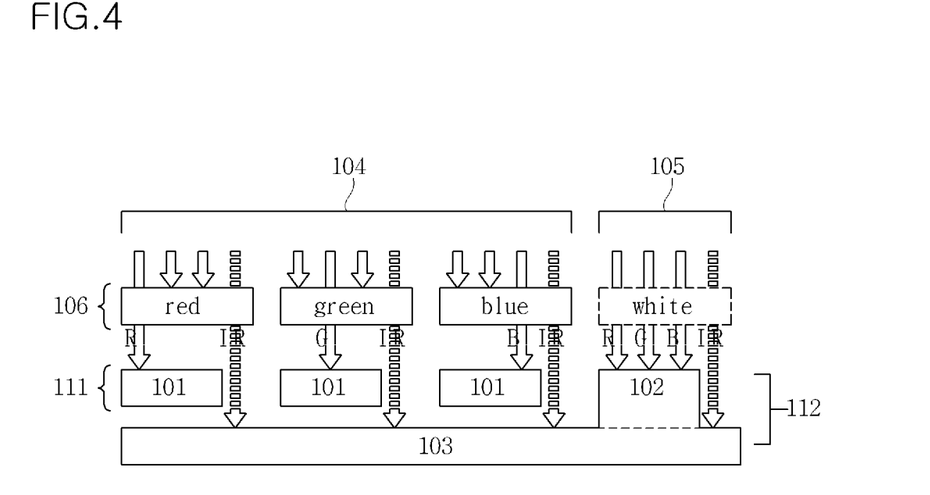
FIG. 4 is a diagram illustrating a schematic cross-sectional view of an image sensor according to an exemplary embodiment.

FIG. 4 shows a schematic cross-sectional view of an image sensor which includes a color filter 106 according to an exemplary embodiment. Referring to FIG. 4, the image sensor comprises the color filter 106 and a plurality of light receiving units 101, 102, and 103.

The color filter 106 comprises color filter parts 104 and a transparent part 105, and does not block infrared radiation. An RGB filter may be used as the color filter parts 104 that pass red, green, or blue light, and the transparent part 105 may be formed of a transparent plastic.

A first light receiving unit 101 is disposed under the color filter parts 104, and a second receiving unit 102 is disposed under the transparent part 105. Both the first and second light receiving units 101 and 102 may be disposed on the same surface. A third light receiving unit 103 may be located below the first or second light receiving unit 101 or 102.

Where the image sensor in accordance with an exemplary embodiment is used for a digital camera, light reflected from an object to be photographed is incident to the image sensor, passing through a specific lens. The incident light first passes through the color filter 106, which allows light of the specific wavelengths to pass through the color filter parts 104. For example, an RGB filter as the color filter parts 104 allows red, green, and blue light selectively to reach the first light receiving unit 101 under the color filter parts 104. On the other hands, all light passes through the transparent part 105 to reach the second light receiving unit 102 without being filtered. Therefore, according to an exemplary embodiment, the first light receiving unit 101 may detect color information such as an RGB signal through the color filter parts 104, and the second light receiving unit 102 may detect brightness information such as a white signal through the transparent part 105.

Furthermore, since the color filter 106 does not block the infrared radiation and the first and second light receiving units 101 and 102 pass the infrared radiation, the third light receiving unit 103 disposed under the first light receiving unit 101 and the second light receiving unit 102 may detect the infrared light, for example, a 4 IR signal corresponding to a number of parts of the color filter 106.

According to another exemplary embodiment, a plurality of the first light receiving units 101 may form a unit of an RGB pixel 111. For instance, three of the first light receiving units 101, forming one unit of the RGB pixel, may detect a red signal, a green signal, and a blue signal, respectively. Moreover, the second light receiving unit 102 and the third light receiving unit 103 may be integrated together to form a white+infrared radiation (W+IR wide-band) pixel unit 112. A white (W) pixel unit may be the second light receiving unit 102 which detects white light at the same layer as the RGB pixel unit 111, and an IR pixel unit may be the third light receiving unit 103 which detects the infrared radiation as a bottom layer or at the bottom of a layer having the RGB pixel unit 111 disposed thereon.

As such, a plurality of the first light receiving units 101, which are arranged two-dimensionally, detect color information, respectively, and hence crosstalk between color components may be reduced. Also the second light receiving unit 102 and the third light receiving unit 103 may extract additional information such as white information and IR information, whereby a high-sensitivity image may be obtained even in low light.

Figure 5:
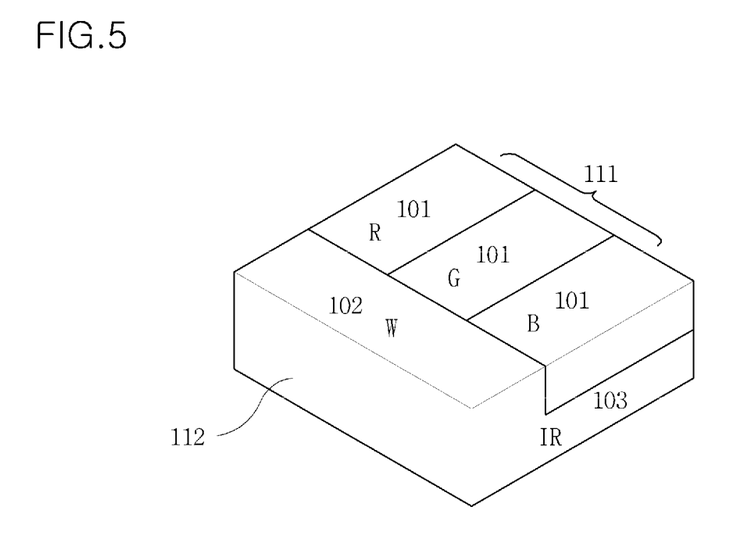
FIG. 5 is a block diagram illustrating an image sensor according to an exemplary embodiment.
Figure 6:
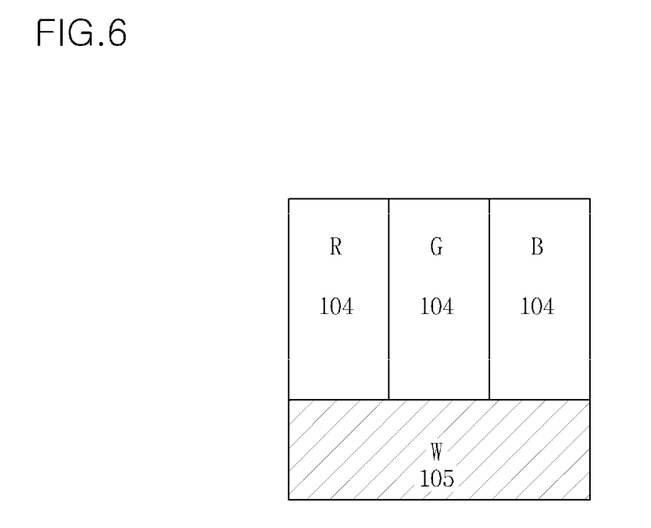
FIG. 6 is a diagram illustrating an exemplary color filter usable in the multilayer image sensor of FIG. 5.

FIG. 5 shows an image sensor according to another exemplary embodiment. Referring to FIG. 5, the image sensor is configured by two layers like the image sensor in FIG. 1, and comprises a plurality of light receiving units 101, 102, and 103. This embodiment relates to the arrangement of the first light receiving unit 101 and the second light receiving unit 102, and it is understood that the arrangement is not limited thereto. For example, the second light receiving unit 102 may be disposed at the center of a top layer and the first light receiving units 101 may be placed around the second light receiving unit 102. A color filter (for example, corresponding to the color filter parts described above) may be disposed over the first light receiving units 101 to pass light within specific wavelength ranges in a light spectrum, and a filter (for example, corresponding to the transparent filter described above) may be disposed over the second light receiving unit 102 to pass light of the entire wavelengths in a visible region of the light spectrum. As an example, a color filter shown in FIG. 6 may be used. In FIG. 6, color filter parts 104 R, G, and B selectively pass red light, green light, and blue light, respectively, and a transparent part 105 W passes light of all wavelengths of the visible region. Referring to FIG. 5 again, three of the first light receiving units 101 may form one unit. For example, the three of the first light receiving units 101 may compose an RGB pixel unit 111 that selectively detects red light, green light, and blue light from visible light. Moreover, the second light receiving unit 102 and a third light receiving unit 103 may be integrated together to form a W+IR pixel unit 112 that detects the visible light and the infrared radiation. The second light receiving unit 102 may be used as a white pixel unit that detects the white light at the same layer as the RGB pixel unit 111, and the third light receiving unit 103 may be used as an IR pixel unit that detects the infrared radiation at a lower part of or below the RGB pixel unit 111.

Figure 9:
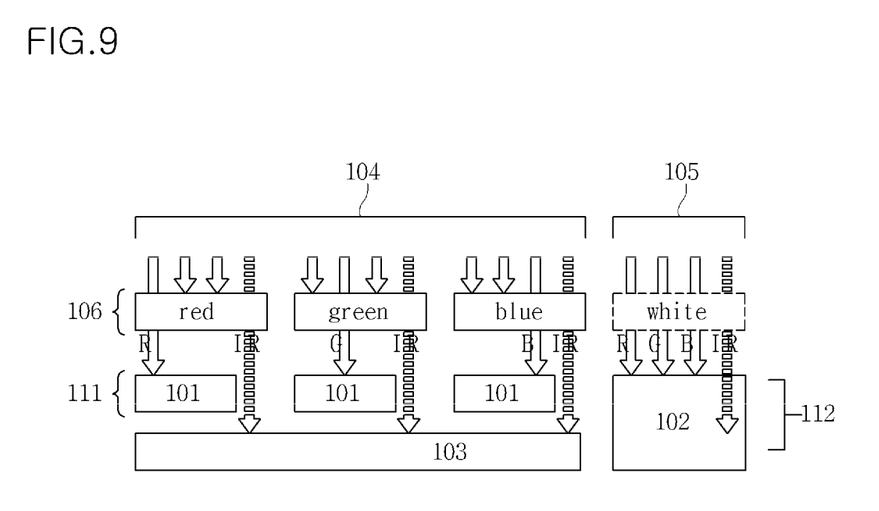
FIGS. 9 through 11 are cross-sectional view diagrams illustrating configuration of a second light unit and a third light receiving unit according to exemplary embodiments.
Figure 10:
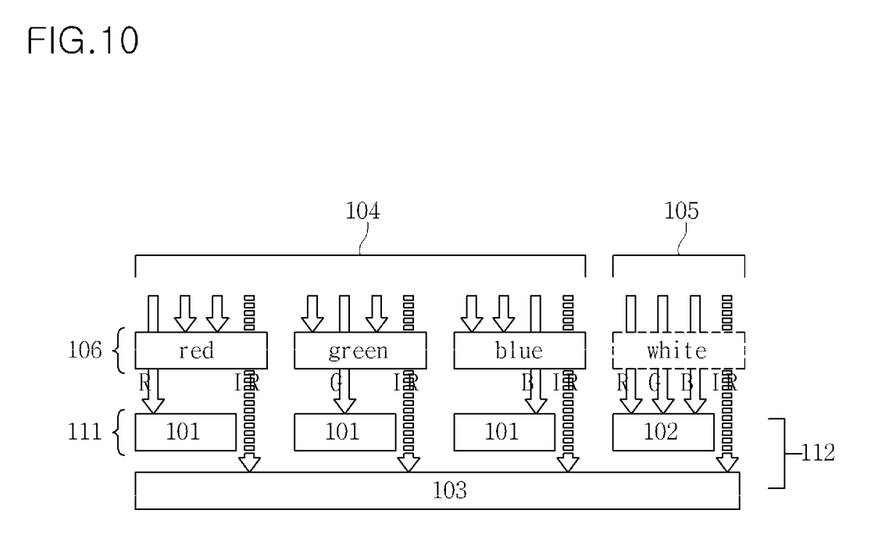

Although it is described that the second and third light receiving units 102 and 103 are integrated together in an embodiment described above, it is understood that the second and third light receiving units may be formed independently from each other, as shown in FIGS. 9 and 10.

Figure 11:
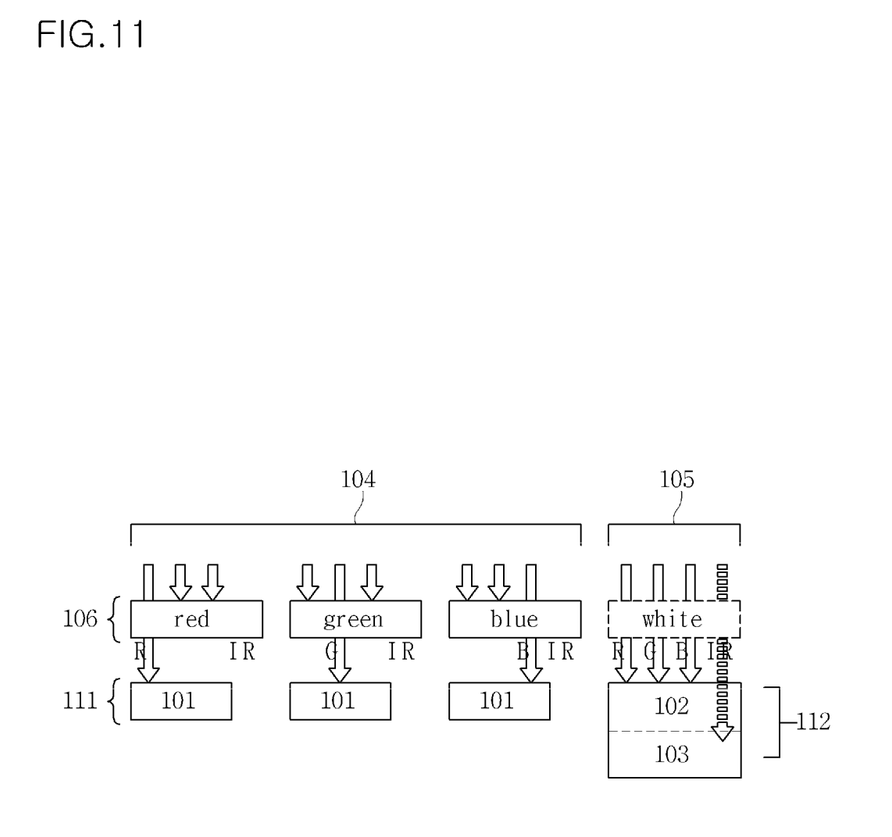

According to still another embodiment, where the second and third light receiving units 102 and 103 are integrated, the third light receiving unit 103 may be disposed under only the second light receiving unit 102 as shown in FIG. 11.

Figure 7:
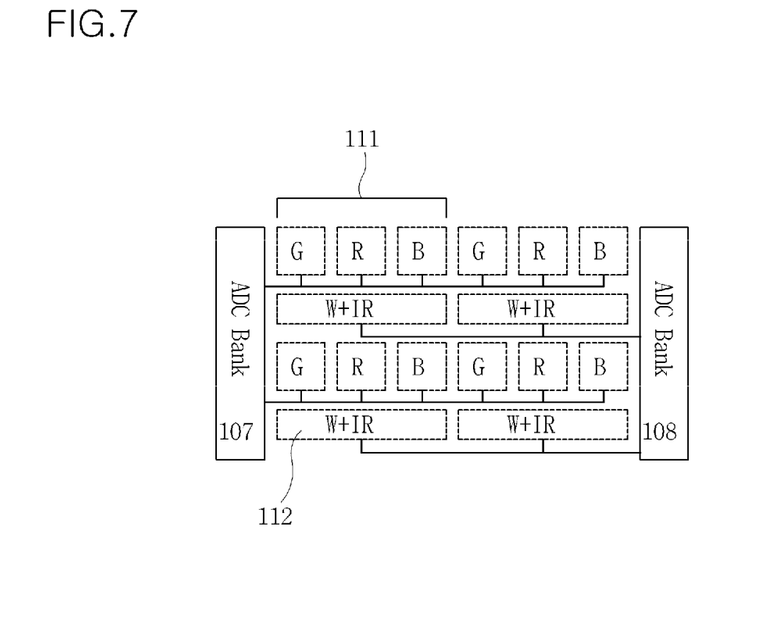
FIG. 7 is a diagram illustrating a readout connection in an image sensor according to an exemplary embodiment.

FIG. 7 shows a readout connection in an image sensor according to an exemplary embodiment. In FIG. 7, the image sensor comprises RGB pixel units 111, each of which is formed of first light receiving units 101 (referring to FIG. 5), and wide-band pixel units 112, each of which is formed of a second and a third light receiving units 102 and 103 (referring to FIG. 5).

As illustrated, the RGB pixel units 111 and the wide-band pixel units 112 may be connected to different control units 107 and 108, respectively, by additional readout circuits. That is, according to an exemplary embodiment, separate readouts are provided for an RGB signal and a W+4 IR signal. Here, the control units 107 and 108 execute various control operations such as converting electric signals output from the respective pixel units 111 and 112 into digital signals and controlling the exposure times of the respective pixel units 111 and 112. Two control units 107 and 108 are provided in FIG. 7 to emphasize the individual control over the RGB pixel units 111 and the wide-band pixel units 112 and, for example, at different times, according to an exemplary embodiment. It is understood that a different number of control unit may be utilized in an image sensor according to exemplary embodiment.

Figure 8:
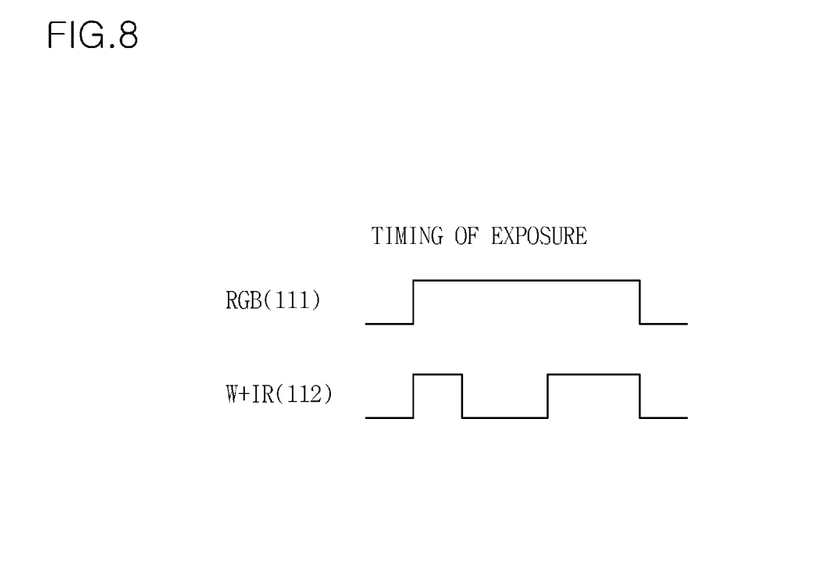
FIG. 8 is a diagram illustrating signals for individually controlling each pixel according to an exemplary embodiment.

Since the RGB pixel units 111 and wide-band pixel units 112 receive light of different wavelength ranges, the light exposure times for the respective pixel units 111 and 112 may need to be controlled. For example, since light of the entire wavelength ranges of the visible region is incident to the wide-band pixel units 112 without being filtered, the light exposure time for the wide-band pixel units 112 may be shorter than that of the RGB pixel unit 111. Such light exposure time may be controlled by control signals shown in FIG. 8. Referring to FIG. 8, different control signals are assigned to the RGB pixel units 111 and the wide-band pixel units 112. The control signals may be provided to the respective pixel units 111 and 112 by the control units 107 and 108. In FIG. 8, where the pixel units 111 and 112 are exposed to light in response to the control signal at a high level, the light exposure time for the wide-band pixel units 112 may be controlled to be shorter than that of the RGB pixel unit 111.

That is, the light exposure time of the wide-band pixel units 112 is set to be shorter than that of the RGB pixel units 111 since the wide-band pixel units 112 may be more sensitive to light than the RGB pixel units 111. Accordingly, a higher quality image may be achieved.

According to an aspect, there is provided a multilayer image sensor which may obtain both a color image and a black-and-white image containing infrared radiation (IR) information.

According to another aspect, the multilayer image sensor may include an upper layer where both the color and black-and-white images are obtained and a lower layer where the IR information is obtained.

According to another aspect, the IR information may be obtained by a color filter which does not block the infrared radiation and utilizing the characteristic of difference in light absorption positions according to the light wavelengths, and the black-and-white image may be obtained by a transparent part of the color filter. That is, an IR signal belonging to a band out of a visible band of a light spectrum may be used.

According to another aspect, information of each color may be extracted two-dimensionally.

According to certain embodiments disclosed above, sensitivity of the image may be improved, a high-sensitivity image may be achieved even in low light, and/or color stroke between colors may be reduced.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:
1. A multilayer image sensor comprising:
    a first light receiving unit configured to detect color light which corresponds to specific wavelength ranges in a visible region of a light spectrum;
    a second light receiving unit configured to detect white light which corresponds to all wavelength ranges in the visible region of the light spectrum, and to be disposed on the same layer as the first light receiving unit; and
    a third light receiving unit configured to detect infrared light which corresponds to specific wavelength ranges in a infrared region of the light spectrum, and to be disposed as a lower layer below the first light receiving unit and the second light receiving unit;
    wherein the first light receiving unit is connected to a first read-out circuit to provide a first information of light, the second light receiving unit and the third light receiving unit are connected to a second read-out circuit to provide a second information of light which is in a wider band than the first information.

2. The multilayer image sensor of claim 1, wherein the first light receiving unit extracts color information of incident light.

3. The multilayer image sensor of claim 2, wherein the color information is one of a red-green-blue (RGB) signal and a cyan-magenta-yellow (CMY) signal.

4. The multilayer image sensor of claim 3, wherein the second and third light receiving units extract a white and infrared radiation (W+IR) signal.

5. The multilayer image sensor of claim 4, further comprising:
a readout circuit provided for the RGB or CMY signal; and
a different readout circuit provided for the W+IR signal.

6. The multilayer image sensor of claim 5, wherein the first and second light receiving units pass light of the infrared region, and the third light receiving unit is disposed with respect to the first and second light receiving units so that the extracted W+IR signal is a W+4 IR signal.

7. The multilayer image sensor of claim 1, wherein:
the first light receiving unit detects red light, green light, or blue light, and converts the amount of the light detected thereby into an electric signal,
the second light receiving unit detects the white light, and converts the amount of the white light detected thereby into an electric signal, and
the third light receiving unit detects infrared light, and converts the amount of the infrared light detected thereby into an electric signal.

8. The multilayer image sensor of claim 1, wherein the first and second light receiving units pass light of the infrared region.

9. The multilayer image sensor of claim 8, wherein the multilayer image sensor simultaneously obtains both a color image and a black-and-white image containing infrared radiation (IR) information.

10. The multilayer image sensor of claim 1, wherein the second and third light receiving units are integrated together or formed independently from each other.

11. The multilayer image sensor of claim 1, further comprising:
a color filter which comprises color filter parts that pass the light of specific wavelength ranges within the visible region and the light of the infrared region, and a transparent part that passes the white light and the light of the infrared region.

12. The multilayer image sensor of claim 11, wherein the first light receiving unit is disposed under the color filter parts, and the second light receiving unit is disposed under the transparent part.

13. A multilayer image sensor comprising:
a pixel unit configured to detect light of a specific wavelength range within a visible region of a light spectrum; and
a white and infrared radiation (wide-band) pixel unit configured to detect all visible light of the visible region and infrared light within an infrared region of the light spectrum,
wherein the wide-band pixel unit comprises a white pixel unit which is disposed on the same layer as the pixel unit and detects all visible light of the visible region, and an IR pixel unit which is disposed under the pixel unit and the white pixel unit and detects the infrared light within the infrared region.

14. The multilayer image sensor of claim 13, wherein the pixel unit is one of a red-green-blue (RGB) pixel unit and a cyan-magenta-yellow (CMY) pixel unit.

15. The multilayer image sensor of claim 14, wherein the RGB pixel unit is formed of a plurality of light receiving elements, each of which detects red, green, or blue light, and converts the amount of the detected light into an electric signal.

16. The multilayer image sensor of claim 14, wherein the pixel unit and the wide-band pixel unit are controlled individually by different readout circuits.

17. The multilayer image sensor of claim 16, wherein the wide-band pixel unit and the pixel unit are controlled such that a light exposure time of the wide-band pixel unit is set to be shorter than that of the pixel unit.

18. An image sensor comprising a multilayer structure having a first light receiving unit to extract a signal corresponding to color information of incident light of a visible region and a second light receiving unit to extract a signal corresponding to light of an infrared region and white light corresponding to the visible region,
wherein a part of the second light receiving unit is disposed under the first light receiving unit.

19. The image sensor of claim 18, wherein:
the first light receiving unit detects light of specific wavelength ranges within the visible region, and
the second light receiving unit comprises a light receiving unit which detects the white light and a light receiving unit which detects the light of the infrared region.

20. The image sensor of claim 19, wherein:
the signal extracted by the first light receiving unit is one of a red-green-blue (RGB) signal and a cyan-magenta-yellow (CMY) signal, and
the signal extracted by the second light receiving unit is a white and infrared radiation (W+IR) signal.

21. The image sensor of claim 20, wherein the first light receiving unit and the light receiving unit which detects the white light pass light of the infrared region, and the light receiving unit which detects the light of the infrared region is disposed with respect to the first light receiving unit and the light receiving unit which detects the white light so that the extracted W+IR signal is one of a W+IR signal, a W+2 IR signal, a W+3 IR signal, and a W+4 IR signal.

22. The image sensor of claim 20, further comprising:
a readout circuit provided for the RGB or CMY signal; and
a different readout circuit provided for the W+IR signal.

23. An image sensor comprising a multilayer structure having a first light receiving unit to extract a signal corresponding to color information of incident light of a visible region and a second light receiving unit to extract a signal corresponding to light of an infrared region and white light corresponding to the visible region, wherein the first light receiving unit detects light of specific wavelength ranges within the visible region, and different readout circuits are provided for the signal corresponding to the color information and the signal corresponding to the light of the infrared region, and
wherein a part of the second light receiving unit is disposed under the first light receiving unit.

* * * * *